(12) United States Patent
Robucci et al.

(10) Patent No.: US 10,228,801 B2
(45) Date of Patent: Mar. 12, 2019

(54) SYSTEM AND METHOD FOR PROXIMITY-BASED POSITION, MOVEMENT AND GESTURE DETECTION USING CAPACITIVE SENSOR ARRAYS

(71) Applicant: University of Maryland, Baltimore County, Baltimore, MD (US)

(72) Inventors: Ryan Robucci, Halethorpe, MD (US); Nilanjan Banerjee, Columbia, MD (US)

(73) Assignee: University of Maryland, Baltimore County, Baltimore, MD (US)

( * ) Notice: Subject to any disclaimer, the term of this patent is extended or adjusted under 35 U.S.C. 154(b) by 5 days.

(21) Appl. No.: 14/523,347

(22) Filed: Oct. 24, 2014

(65) Prior Publication Data

US 2015/0199045 A1 Jul. 16, 2015

Related U.S. Application Data

(60) Provisional application No. 61/894,987, filed on Oct. 24, 2013.

(51) Int. Cl.
| | | |
|---|---|---|
| *G06F 3/045* | (2006.01) | |
| *G06F 3/044* | (2006.01) | |
| *G06F 3/0488* | (2013.01) | |
| *H03K 17/96* | (2006.01) | |
| *G06F 3/0346* | (2013.01) | |

(52) U.S. Cl.
CPC .......... *G06F 3/044* (2013.01); *G06F 3/0346* (2013.01); *G06F 3/0488* (2013.01); *H03K 17/9622* (2013.01); *G06F 2203/0331* (2013.01); *G06F 2203/0381* (2013.01)

(58) Field of Classification Search
CPC ........ G06F 3/016; G06F 3/0416; G06F 3/044; G06F 1/163; G06F 2203/04102; G06F 2203/04107; H03K 17/9622; H03K 2017/9602; H03K 2217/94094
See application file for complete search history.

(56) References Cited

U.S. PATENT DOCUMENTS

| | | | |
|---|---|---|---|
| 2009/0033341 A1 | 2/2009 | Son et al. | |
| 2013/0185003 A1 | 7/2013 | Carbeck et al. | |
| 2013/0231711 A1* | 9/2013 | Kaib | G06F 19/3418 607/5 |
| 2013/0265276 A1* | 10/2013 | Obeidat | G06F 3/044 345/174 |

(Continued)

OTHER PUBLICATIONS

International Search Report for PCT Application No. PCT/US2015/036495, dated Oct. 23, 2015.

(Continued)

*Primary Examiner* — Nelson Rosario

(74) *Attorney, Agent, or Firm* — Kaplan Breyer Schwarz, LLP

(57) ABSTRACT

Systems and methods for proximity-based position, movement and gesture detection are provided that utilize capacitive sensor arrays. In one embodiment, the system utilizes textile-based capacitive sensor arrays that can be integrated into other textiles, such as clothing, bed linens, etc., or that can be integrated into the environment (e.g., furniture, wheelchairs, car seats, etc.). The system recognizes gestures from detected movement by utilizing hierarchical signal processing techniques.

18 Claims, 19 Drawing Sheets

(56) References Cited

U.S. PATENT DOCUMENTS

2014/0139239 A1   5/2014  Zachut et al.
2015/0091846 A1*  4/2015  Small .................... G06F 3/0412
                                                      345/174
2015/0301603 A1* 10/2015  Maggiali ................ G06F 3/044
                                                      345/174

OTHER PUBLICATIONS

Written Opinion for PCT Application No. PCT/US2015/036495, dated Oct. 23, 2015.

* cited by examiner

Algorithm 1 CaptureEventMessages $\left(\Delta T = \dfrac{1}{Sampling\ rate}\right)$ ---
Event $E_1$ = first event.
gesturetimeout = eventduration ($E_1$)
for every $\Delta T$ seconds
    IF gesturetimeout == 0
        *break*
    end IF
    decrement gesturetimeout
    IF Event $E_i$ is collected from observation $i$.
        gesturetimeout += eventduration($E_i$)
    end IF
end for
return TRUE

FIG.5

| Module | Sleep power | Active Power |
|---|---|---|
| micro-controller | 2.2 μA | 505.0 μA |
| cap./observation meas. IC | 152.0 μA (low power) | 1148.0 μA |
| BLE | 0.5 μA | 8.1 mA (idle), 20.7 mA (tx) |

TABLE I. THE TABLE PRESENTS MICRO-BENCHMARKS ON POWER CONSUMPTION OF DIFFERENT COMPONENTS ON OUR CUSTOM DESIGNED DATA COLLECTION MODULE.

| Module | Latency |
|---|---|
| micro-controller wakeup | 36 μs |
| micro-controller (ML algo) | 286 ms |
| Bluetooth wakeup | 450 μs |

TABLE II. THE LATENCY OF EACH COMPONENT

| Context | Movements | Casual Effects |
|---|---|---|
| post-drug administration | energetic (fast) motion | tremors |
| Wakeup (time=[7AM-8AM]) | lethargic (slow) motion | call nurse, raise bed |
| Lunch (time=[12PM-1PM]) | lethargic (slow) motion | turn on TV |

FIG.14

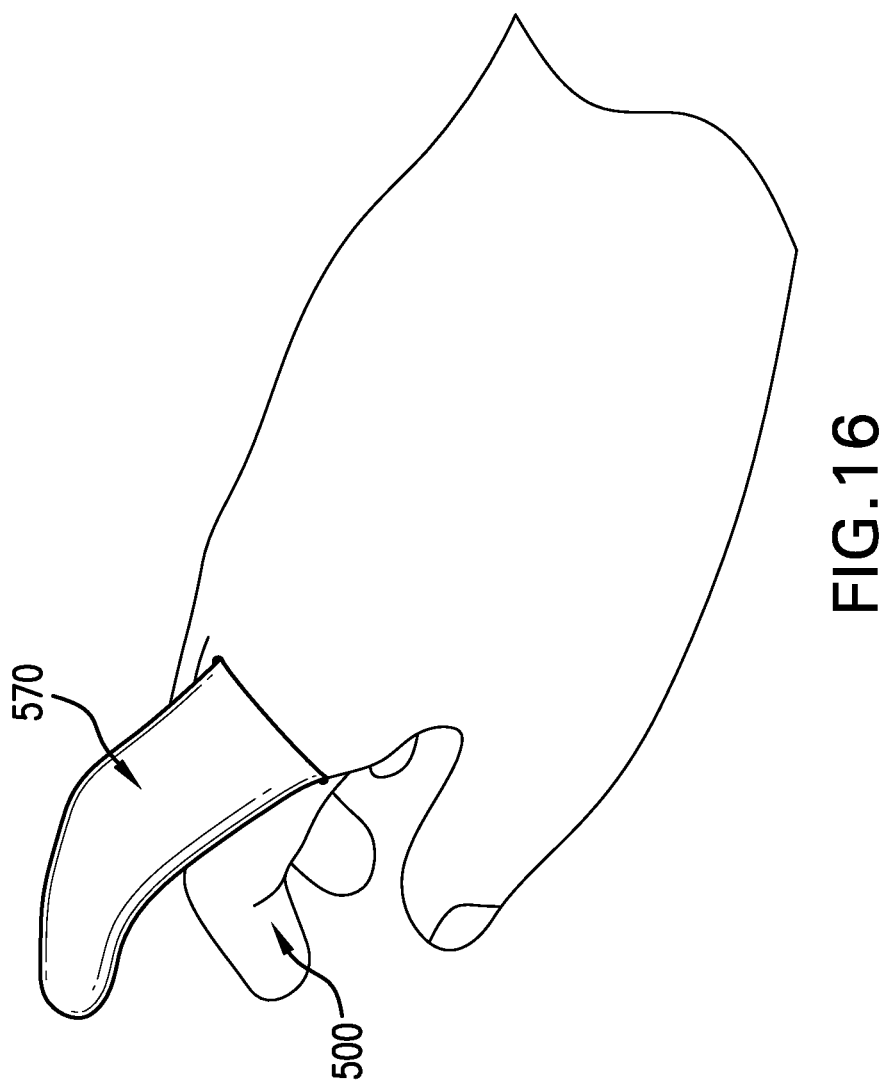

SYSTEM AND METHOD FOR PROXIMITY-BASED POSITION, MOVEMENT AND GESTURE DETECTION USING CAPACITIVE SENSOR ARRAYS

This application claims priority to U.S. Provisional Application Ser. No. 61/894,987 filed Oct. 24, 2013, whose entire disclosure is incorporated herein by reference.

BACKGROUND OF THE INVENTION

1. Field of the Invention

The present invention relates generally to position, movement and gesture detection and, more specifically, to proximity-based position, movement and gesture detection utilizing hierarchical capacitive sensing.

2. Background of the Related Art

The Background of the Related Art and the Detailed Description of Preferred Embodiments below cite numerous technical references, which are listed in the Appendix below. The numbers shown in brackets ("[ ]") refer to specific references listed in the Appendix. For example, "[1]" refers to reference "1" in the Appendix below. All of the references listed in the Appendix below are incorporated by reference herein in their entirety.

Home automation and environmental control is a key feature of smart homes. While systems for home automation and control exist, there are few systems that interact with individuals suffering from paralysis, paresis, weakness and limited range of motion that are common sequels resulting from severe injuries such as stroke, brain injury, spinal cord injury and many chronic (guillian barre syndrome) and degenerative (amyotrophic lateral sclerosis) conditions.

Indeed, an estimated 1.5 million individuals in the United States are hospitalized each year because of strokes, brain injuries and spinal cord injuries. Severe impairment such as paralysis, paresis, weakness and limited range of motion are common sequels resulting from these injuries requiring extensive rehabilitation. Changes in healthcare reimbursement over the past decade have resulted in shorter lengths of stay at hospitals and limitations on the amount of therapy that patients can receive post acute care. These changes present medical rehabilitation practitioners with a challenge to do more for patients with less time and resources.

It is imperative that practitioners implement assistive technologies efficiently and effectively to help patients maximize independence as early in the rehabilitation process as possible and provide methods to augment and supplement direct care that can be utilized over time to support recovery. This is particularly true for patient conditions where physical recovery can be a slow process over many years.

While assistive technology options currently exist to support access to communication and environmental control [1, 2], challenges remain that pose a barrier to early and efficient use of assistive technology in medical and settings. Current gesture recognition systems do not adapt to changes in body position and environmental noise. There is need for motion and gesture sensing solution that can: (1) reliably capture gestures regardless of the type of user, type of motion being captured and usage context; (2) that requires minimal set-up and maintenance; (3) causes minimal fatigue; and (4) is less intrusive than current solutions.

SUMMARY OF THE INVENTION

An object of the invention is to solve at least the above problems and/or disadvantages and to provide at least the advantages described hereinafter.

Therefore, an object of the present invention is to provide a system and method for position and movement detection.

Another object of the present invention is to provide a system and method for proximity-based gesture recognition.

Another object of the present invention is to provide a system and method for proximity-based movement and gesture recognition.

Another object of the present invention is to provide textile-based capacitive sensor arrays.

Another object of the present invention is to provide textile-based capacitive sensor arrays that can be integrated into other textiles (e.g., clothing, bed linens), and/or integrated into the environment (e.g., furniture, wheelchairs, car seats, etc.).

Another object of the present invention is to provide a system and method for proximity-based movement and gesture recognition that utilizes textile-based capacitive sensor arrays Another object of the present invention is to provide a hierarchical signal processing system and method for gesture recognition.

Another object of the present invention is to provide a hierarchical signal processing system and method for gesture recognition that is capable of switching between a low power state and a high power state.

Another object of the present invention is to provide a system and method for proximity-based movement and gesture recognition that utilizes capacitive sensor arrays and inertial sensors.

Another object of the present invention is to provide a self-learning system and method for proximity-based movement and gesture recognition that utilizes capacitive sensor arrays and inertial sensors.

Another object of the present invention is to provide a system and method for providing biofeedback to a user utilizing a proximity-based movement and gesture recognition system.

To achieve at least the above objects, in whole or in part, there is provided a detection system for detecting the position and motion of an object, said object characterized by a conductivity and/or permittivity that will alter the capacitance of a capacitor when the object is in sufficiently close proximity to the capacitor, comprising a capacitive sensor array comprising at least two flexible conductive plates and a ground layer spaced apart from the at least two flexible conductive plates, and a controller in communication with the at least two flexible conductive plates so as to received signals from the at least two flexible conductive plates, wherein the at least two flexible conductive plates are sized and shaped so as to generate signals when the object is within a predetermined distance range from the at least two flexible conductive plates, and wherein the controller determines if the conductive object is moving based on the signals generated by the at least two flexible conductive plates.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 5 shows an example of an algorithm for updating the value of gesturetimeout, in accordance with one preferred embodiment of the present invention;

FIG. 7 are two tables that show the power consumption and the latency of various subsystems, in accordance with one preferred embodiment of the present invention;

FIG. 8B is a confusion matrix that illustrates the percentage of gestures classified and misclassified for sixteen gestures, in accordance with one preferred embodiment of the present invention;

FIG. 14 is a table that shows the causal relationship between context (e.g., time) and patient conditions (e.g., drug administration and body movements), in accordance with one preferred embodiment of the present invention;

FIG. 16 shows a mockup of a single frame from a visual display for providing feedback for a finger movement gesture, in accordance with one preferred embodiment of the present invention.

DETAILED DESCRIPTION OF PREFERRED EMBODIMENTS

Figure 1:
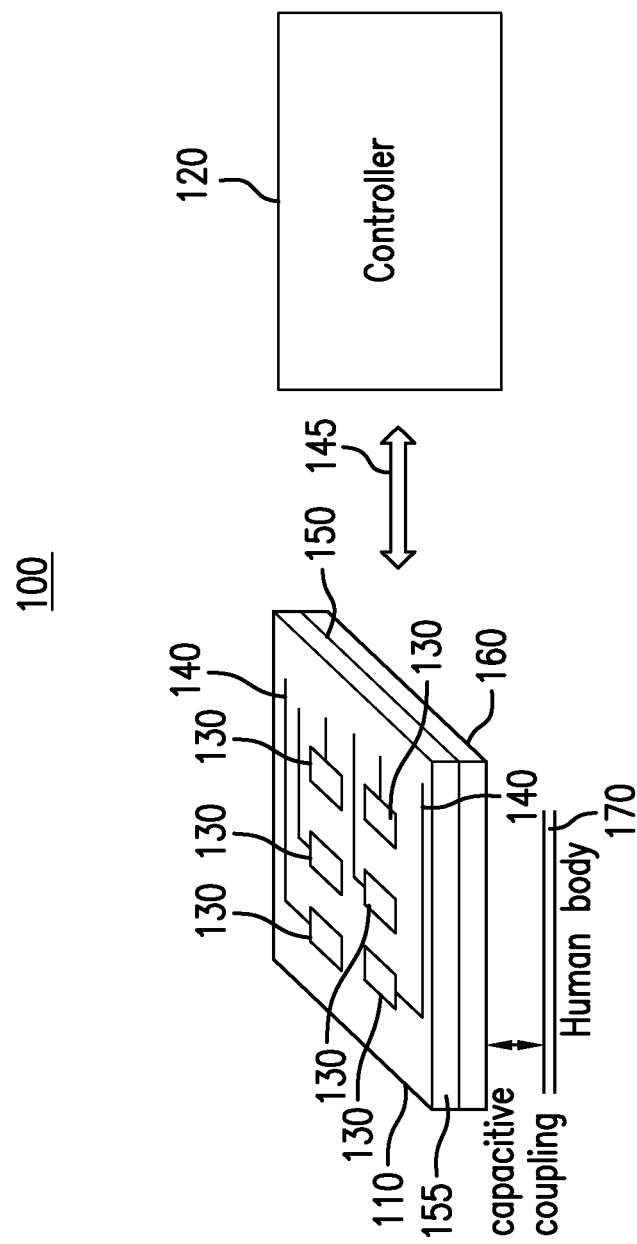
FIG. 1 is a schematic diagram illustrating a proximity-based motion detection system, in accordance with one preferred embodiment of the present invention.

The systems and methods of the present invention are particularly suited for movement and gesture detection and recognition in the context of users with mobility impairments, and thus some of the systems and methods of the present invention will be described and illustrated in this context. However, it should be appreciated that the present invention can be utilized in any motion detection and/or gesture recognition application in which the detection of the motion of other types of objects is desired.

Gesture recognition-based environmental control systems are capable of giving patients with mobility impairments greater control over their environment. Several techniques, such as the use of inertial sensors, vision systems, and other forms of tracking, can be used to capture body gestures [3, 4, 5, 6, 7]. Gesture recognition systems for individuals with mobility impairments, however, present a set of fundamental challenges that typical gesture recognition systems often fail to address.

First, sensors for gesture recognition are intrusive, bulky, or expensive [8]. Eye tracking systems necessitate the use of mounted cameras while evoked-potential or touch-based systems use electrodes that can cause skin irritation and abrasion, which are conditions that can have a deleterious effect if unnoticed due to diminished sensation in the extremities. Second, existing systems are often not suitable for mobility impairments, as they assume certain motions which a person may not be able to complete.

For example, precise gestures are difficult to perform for individuals that suffer from paralysis, and physical capabilities vary widely among individuals. Further, individuals with paralysis have reduced skin sensation, thus touch-pads that require the individual to perform precise touch gestures can cause skin abrasion.

The present invention enables proximity-based motion detection and gesture recognition by utilizing capacitive sensor arrays. In one preferred embodiment, textile-based capacitive sensor arrays are used that are constructed using conductive textile and that can be integrated into other textiles, such as clothing, bed linens, etc., as will be explained in more detail below. In another preferred embodiment, hierarchical signal processing is used for gesture recognition, as will be explained in more detail below.

Capacitive Sensor Arrays for Motion Detection and Gesture Recognition

Capacitive sensing [9] has been used in industrial, automotive, and healthcare applications [10, 11]. For instance, capacitive sensors have been used in positioning [12, 13]; humidity sensing [14, 15]; tilt sensing [16, 17]; pressure sensing [18]; and MEMS-based sensing [18]. Capacitors have also been applied as proximity sensors with applications in robotics, industrial monitoring and healthcare applications [19, 20, 21].

Capacitive sensors work on the principle of change in capacitance due to perturbation in the electric fields between the plates of the capacitor, making them highly versatile. Unlike accelerometers and gyroscopes that measure movement of the body to which they are attached, capacitive sensors can sense movement of remote bodies.

FIG. 1 is a schematic diagram illustrating a proximity-based motion detection system 100, in accordance with one preferred embodiment of the present invention. The system 100 includes a capacitive sensor array (CSA) assembly 105 and a controller 120. The CSA assembly 105 includes a CSA 110 that is made up of at least two capacitor plates 130 and conductive wires 140 that carry signals from the capacitor plates 130. The controller 120 is in communication with the conductive wires 140 via connections 145, which transfer the signals to the controller 120. Connections 145 can be wired connections, wireless connections, wireless inductive connections and/or capacitive connections using systems and methods well known in the art.

The CSA assembly 105 preferably includes an AC shield layer 150, that minimizes parasitic capacitance and noise coupling, as well as a ground layer 160 that capacitively couples a human body 170 to the ground of the CSA assembly 105 and provides a common reference for the capacitance measurements. Although the ground layer 160 is shown as a layer below the CSA 110, it should be appreciated that other configurations can be used while still falling within the scope of the present invention. For example, the AC shield layer 150 and ground layer 160 could be positioned on a side surface 155 of the CSA 110. Further, although FIG. 1 shows that the ground layer 160 is coupled to the human body 170 via capacitive coupling, the ground layer 160 may also be electrically coupled to the human body 170 with a direct electrical connection using a conductive material.

The capacitor plates 130, AC shield 150 and ground plane 160 are preferably made from conductive textile that can be integrated into other textiles, such as clothing, bed linens, etc., or that can be integrated into the environment (e.g., furniture, wheelchairs, car seats, etc.). The term "conductive textile" refers generally to a fabric that can conduct electricity. Conductive textiles can be made with metal strands that are woven into the construction of the textile. Conductive textiles can also be made with conductive fibers which, for example, may consist of a non-conductive or less conductive substrate that is either coated or embedded with electrically conductive elements, such as carbon, nickel, copper, gold, silver or titanium. Examples of non-conductive or less conductive substrates include cotton, polyester, nylon stainless steel. Some examples of commercially available conductive textiles include those manufactured by Shieldex (low resistance, 4 Ohms per centimeter), MedTex (has various varieties such as E 130 DS (13 Ohm per 20 cm) and P 180 OS), LessEmf (stretchable conductive fabric that has a resistance of 13 Ohm per 20 cms), and Zelt Conductive fabric (0.4 Ohms per 20 cm). The CSA 110 is preferably made by cutting patches of different shapes from the conductive textile and sewing them on to the fabric. Connections from the conductive patch (capacitor plate 130) is routed to a capacitance measurement circuit using conductive wires. These conductive wires are suitably ordinary threads coated with silver.

Figure 2:
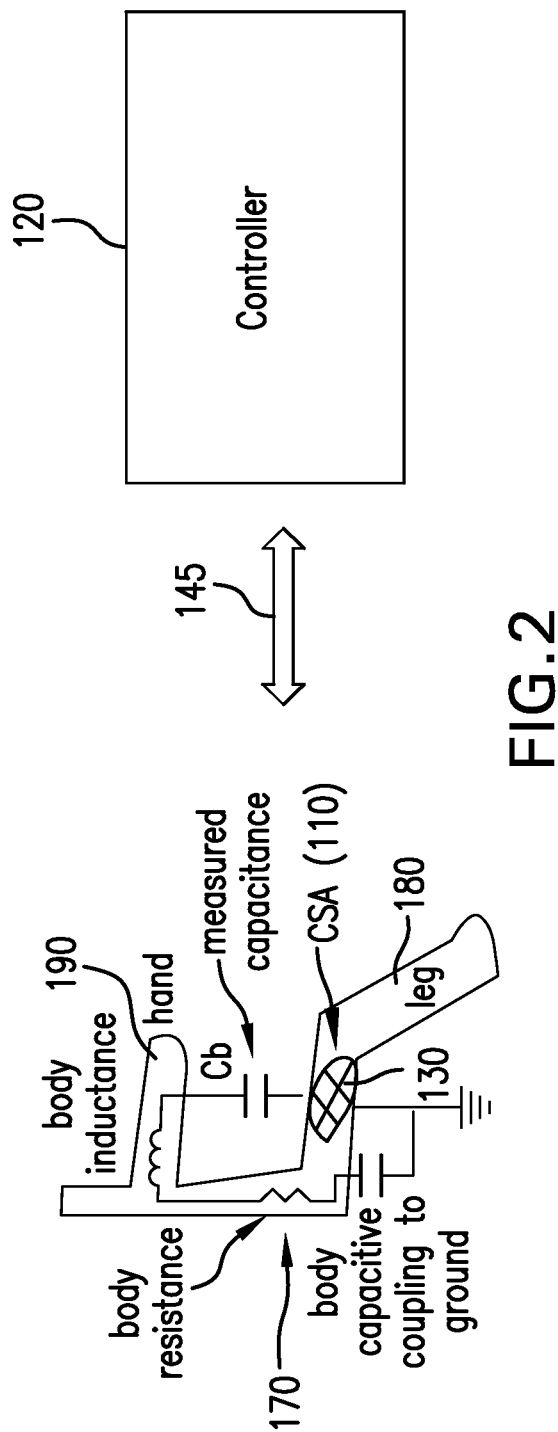
FIG. 2 is a schematic diagram showing a capacitive sensor array attached to the leg of an individual, as well as a schematic representation of the equivalent electrical circuit that is formed, in accordance with one preferred embodiment of the present invention.

FIG. 2 is a schematic diagram showing the CSA 110 attached to the leg 180 of an individual, as well as a schematic representation of the equivalent electrical circuit that is formed. Gestures are performed by moving the hand 190 in the vicinity of the CSA 110. The body 170 of the individual is capacitively coupled to the ground of the CSA 110. When the hand 190 is moved close to the CSA 110, the capacitance $C_b$ increases. Inversely, the value of the capacitance $C_b$ can be used to localize the hand with respect to the individual capacitor plates 130 that make up the CSA 110.

With capacitor plates 130 that have a size of 2 inches by 2 inches, the maximum distance between the hand 190 and the CSA 110 that will cause a measurable change in capacitance is approximately 3 inches. This maximum distance is sufficient to prevent accidental touch and skin abrasion. The maximum distance can be adjusted by varying the size and shape of the capacitor plates 130.

An aspect of the present invention is the use of an array of capacitor plates 130. A CSA 110 has several advantages over a single large capacitor plate. First, taking differentials between capacitor plates 130 helps minimize noise due to stray movements in the vicinity of the plates 130. Secondly, CSA 110 can help capture rich position and motion attributes, such as velocity, and can be used to distinguish gestures.

Figure 3A:
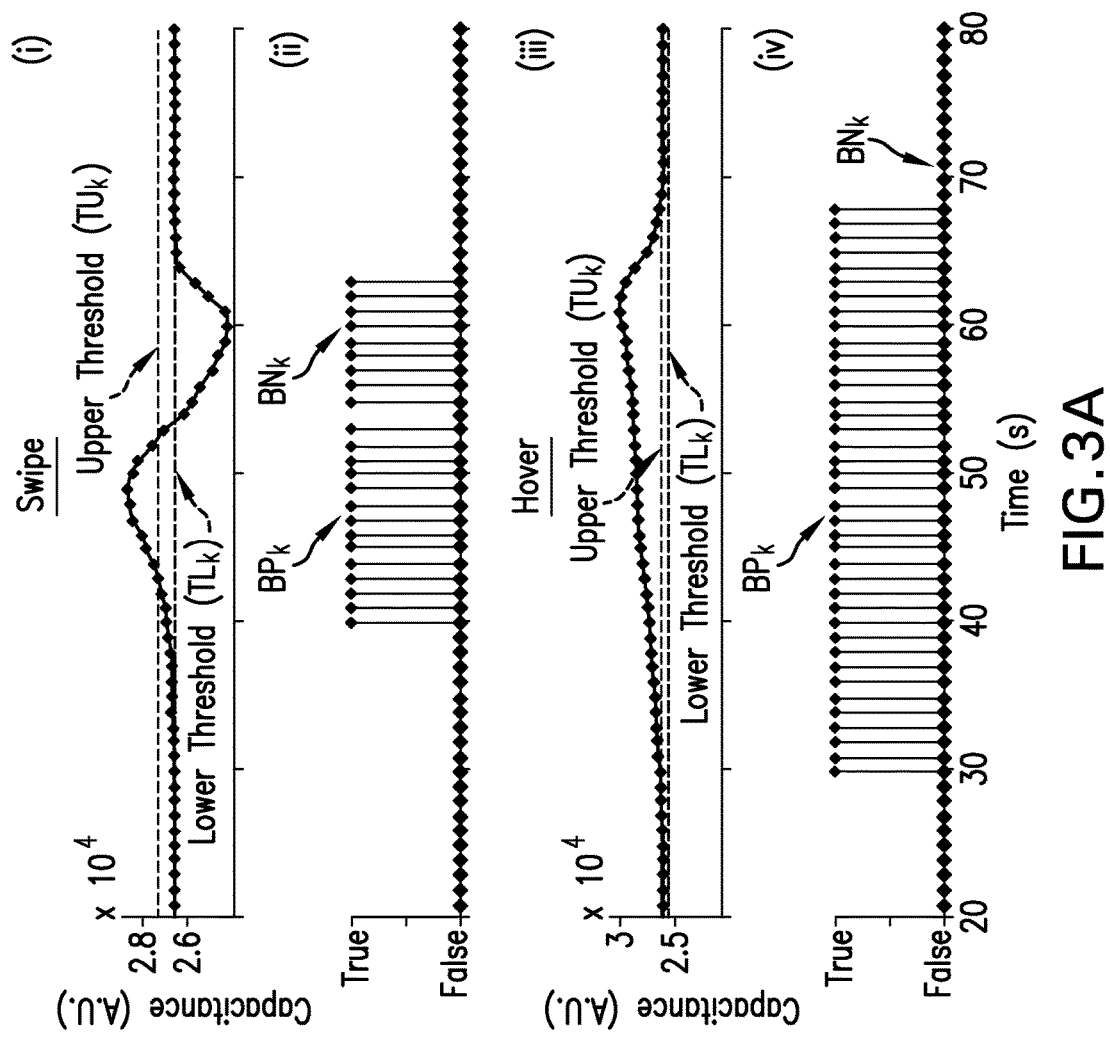
FIG. 3A are graphs showing the analog difference between capacitance measurements taken from two capacitor plates, in accordance with one preferred embodiment of the present invention.

For example, FIG. 3A are graphs, with graph (i) showing the analog difference between two capacitor plates 130 when a hand 190 is moved from one plate 130 to another plate 130 with the subtraction of the two plates 130 creating a peak, followed by a zero crossing, followed by a valley. Features such as width of the peak-valley pair can determine the speed of movement of the hand 190, and their causal order can determine direction of motion. Similarly, the graph (iii) graphs the analog difference in capacitance between plates 130 when the user has their hand 190 above a plate 130 (referred to as a "hover" gesture). The width of the peak in this case can be used to determine the time of the hover.

A CSA 110 can therefore be used to capture movement features such as time, velocity, and position of the hand 190 with respect to the plates 130. It should be appreciated that the "movement" can be movement of the hand relative to the CSA 110 or, conversely, movement of the CSA 110 relative to the hand or other object being measured. In other words, the position and movement being measured is relative to the CSA's frame of reference, and the CSA 110 can itself be moving. The CSA 110 provides different vantage points via multiple capacitor plates 130 for the same movement and can increase the reliability of gesture recognition. Data from the CSA 110 is sent to the controller 120 and is converted into a reliable gesture using hierarchical signal processing, which will be described below. Although FIG. 2 illustrates the CSA 110 being used to detect the position and motion of a hand, it should be appreciated that the CSA 110 can be used to detect the position and motion of any object that is in proximity to the CSA 110, as long as the object exhibits a conductivity and/or permittivity that will alter the capacitance of the CSA 110 when the object is in proximity to the CSA.

Figure 3B:
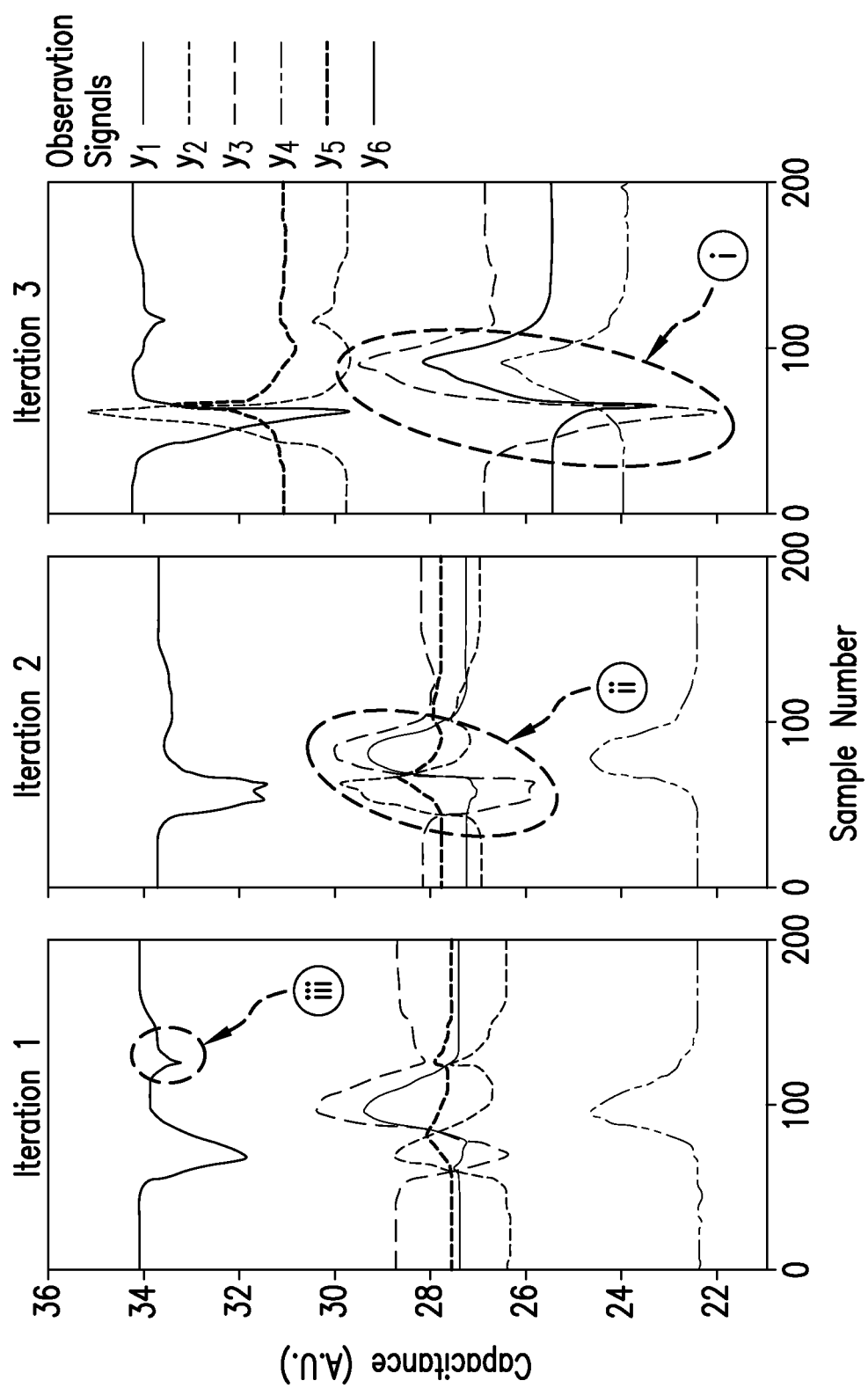
FIG. 3B are graphs illustrating the fundamental challenges in processing the raw capacitance data from a capacitive sensor array.

FIG. 3B are graphs illustrating the fundamental challenges in processing the raw capacitance data from the CSA 110. FIG. 3B shows the capacitance signal from the same gesture performed by the same user at three different times (Iterations 1, 2 and 3). As illustrated by the regions of interest (i) and (ii), there is high irregularity in the signal produced by the user trying to produce the same gesture.

Hierarchical Signal Processing

The operation of the present invention will be described in the context of two broad categories of gestures: (1) swipes—moving the hand 190 (or another body part) from adjacent one capacitor plate 130 to adjacent another capacitor plate 130; and (2) hovers—holding the hand 190 (or another body part) over a capacitor plate 130 and then retracting the hand 190 or other body part.

Through conversations with patients suffering from partial paralysis (e.g., C-6 spinal cord injuries) and their physical therapists, it has been determined that swipes and hovers are gestures that are comfortable to perform. Although the present invention will be described in connection with these two gesture types, the hierarchical signal processing, described below, is a general framework that can be used to determine any type of gesture using a CSA 110 while reducing energy consumption. The hierarchical signal processing described below can be extended to support more complex gestures, such as sign language alphabets [22].

Figure 4A:
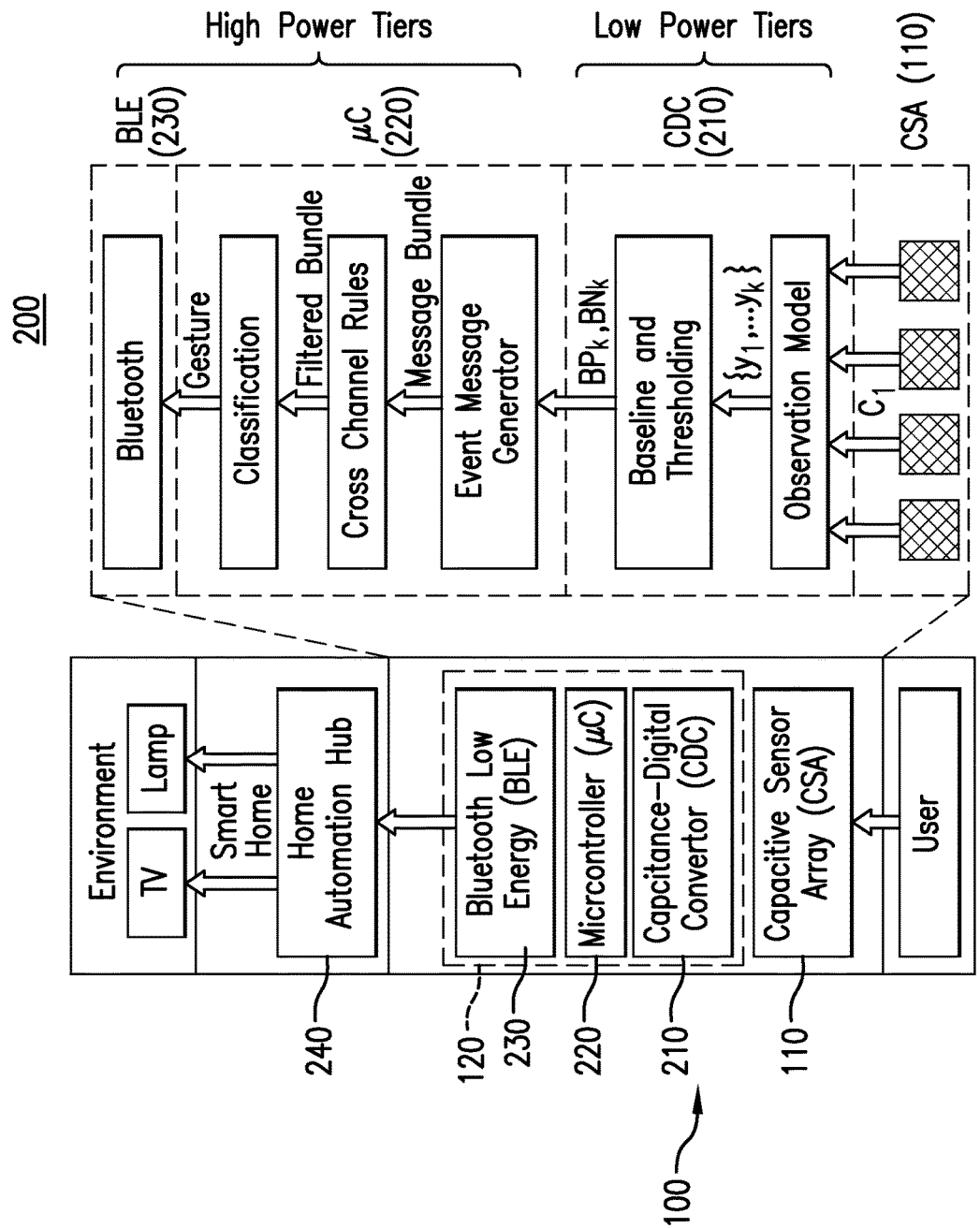
FIG. 4A is a block diagram illustrating an end-to-end gesture recognition system using the proximity-based motion detection system 100, described in the context of a home automation system, in accordance with one preferred embodiment of the present invention.
Figure 4B:
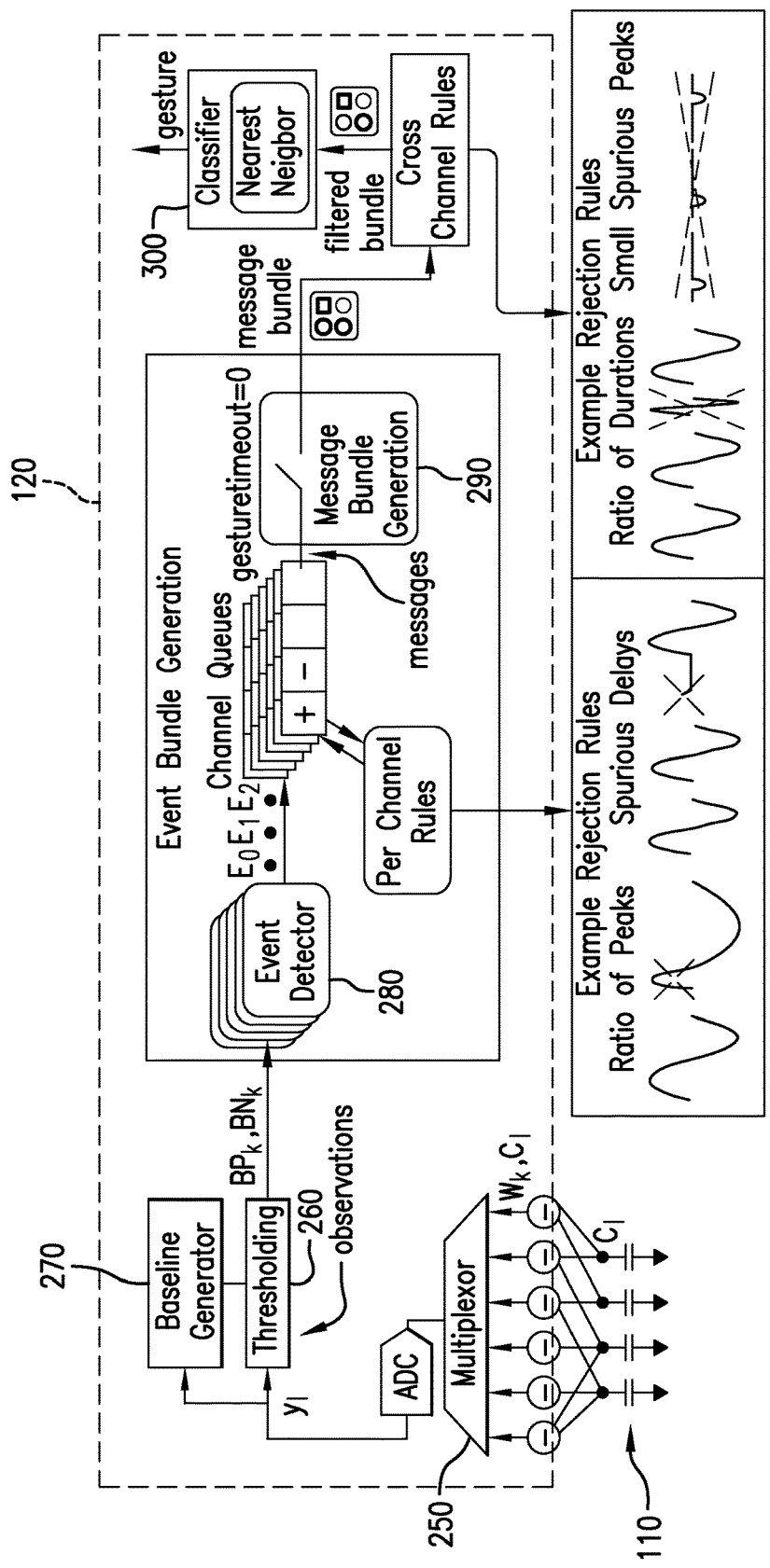
FIG. 4B illustrates how data from modules are processed to generate gestures using a hierarchical signal processing architecture, in accordance with one preferred embodiment of the present invention.

FIG. 4A is a block diagram illustrating an end-to-end gesture recognition system 200 using the proximity-based motion detection system 100, described in the context of a home automation system, while FIG. 4B is a schematic diagram illustrating how the data from the capacitor plates 130 are transformed into gestures using hierarchical signal processing. FIG. 4A illustrates the data flow from the user to the environment through the system 200. The system 200 preferably utilizes a low-power tier and a high power tier.

FIG. 4B illustrates how data from modules are processed to generate gestures using a hierarchical signal processing architecture. The insets in FIG. 4B show examples of how anomalies that represent spurious events that are generated due to noise in the data are filtered, thereby eliminating extraneous information that complicates classification.

The controller 120 used in the system 200 includes a capacitance digital converter 210, a microcontroller 220 and a Bluetooth low energy module 230 for wirelessly communicating with a home automation hub 240. The home automation hub 240 sends control signals to one or more home systems (e.g., a television, lamp, etc.) in response to signals from the controller 120. The signals sent from controller 120 are based on the gestures that the controller 120 interprets from the capacitance signals received from the CSA 110.

The system 200 can train on imprecise swipe and hover gestures performed by a user and can be personalized to a specific user. The hierarchical signal processing is preferably split into a low-power tier and a high-power tier. The low-power tier continuously processes data while waking up the high-power tier only for feature extraction and gesture classification. Such a hierarchical design provides high diligence and system availability at minimal energy consumption. The different tiers in the processing hierarchy is described below and is illustrated in FIG. 4B.

Observations are calculated at the lowest tier of the hierarchy (the low-power tier). These observations are measurements from the capacitor plates 130 taken as linear combinations of capacitance values from the CSA 110. These observations $\{y_1, \ldots, y_k\}$ each follow an observation model $$\sum_{i=1}^{i=n} W_{i,k} \cdot c_i$$

where $W_{i,k} \in \{0, 1, -1\}$, $c_i$ represents the equivalent capacitance between a plate and ground and n is the number of sensor plates. The measurements are taken in a periodic sequential pattern to create a round of measurements, [y1, . . . , yk]. The linear combinations that are computed in the analog domain are controlled through low-power multiplexors 250. A pattern of differential measurements is preferably employed whereby analog subtractions between plates 130 are calculated.

The particular ordering of the measurements does not matter if the gestures are slow compared to the sampling rate. Furthermore, since a machine learning approach is employed in the higher-power tier of the system 200, as long as the same ordering is used for both training and testing, the measurement order is of minimal importance.

The use of differential measurements rejects transient environmental noise, including common noise among the plates. These differential measurements also form a receptive field most sensitive to motions in the proximity of the plates 130, while being more insensitive to motions at a distance as compared to a single-ended measurement. Therefore, the differential measurements can also cancel noise due to stray movements far from the plates 130 and can capture subtle movements close to the plates 130.

A characteristic response of a differential pair from a hand 190 swipe over two capacitor plates 130 is shown in graph (i) of FIG. 3A. In this case, the hand 190 passed successively over each plate 130. Likewise, when the hand 190 only passes over a single plate 130, the characteristic differential response is shown in graph (iii) of FIG. 3A. These two characteristic responses are detected in the system 200 using a pair of threshold detectors 260 capturing positive and negative events illustrated as the low and high thresholds in graphs (ii) and (iv) of FIG. 3A.

The thresholds for the events are established relative to a baseline capacitance for each observation channel generated by a baseline generator 270, which is continually recalculated while there is only minimal changes in the capacitive data. The separation of the thresholds from the baseline was determined in the system 200 using experimental data analysis using a prototype and programmed manually. Alternative designs and applications would require this threshold to be manually adjusted.

The threshold detection is implemented in hardware preferably using an ultra-low power measurement IC, which supports threshold-crossing detection as well as an automatically adjusted baseline offset. Typically this threshold detection functionality is provided for capacitance-based touch determination. However, this generated signal is exploited for robust proximity motion detection using a textile CSA 110.

In addition to the irregularity of the plates 130, the motions (gestures) themselves are much more irregular than a simple touch and cannot be defined as easily from capacitance signals. As shown in FIG. 3B, more complex signals generated due to the conglomeration of hand, forearm, and wrist movements are being sensed, as opposed to single-point finger touch. Feature extraction will now be described, which uses the binary outputs of the digital threshold detectors to build higher-level features used in the final stages of machine learning-based classification.

The threshold signals serve two key purposes for event detection in the next level of the processing hierarchy. First, the temporal binary threshold signals are themselves the only representation of the signal passed to the event detectors 280. This simple compact representation of the signal minimizes the memory requirements for capturing the signal history and feeds into the simplicity of the real-time high-level feature extraction algorithm. Additionally, the binary signals serve a dual purpose as wake-up (interrupt) signals for the higher-level processor which remains in a low-power sleep mode until activity is detected. For each linear observation signal $y_k$, an upper and lower threshold, $TU_k$ and $TL_k$ respectively, are defined on opposite sides of the baseline. Two signals are defined, the positive-peak binary signal $BP_k$ and the negative-peak binary signal $BN_k$ as follows:

$$BP_k[n] = \begin{cases} \text{TRUE} & \text{if } y_k[n] > TU_k \\ \text{FALSE} & \text{otherwise} \end{cases}$$

$$BN_k[n] = \begin{cases} \text{TRUE} & \text{if } y_k[n] < TL_k \\ \text{FALSE} & \text{otherwise} \end{cases}$$

where n is the sample number. The first occurrence of a TRUE value for any $BP_k$ or $BN_k$, after a period of inactivity, triggers the high-power processor to wake up. At the event detectors 280, the binary threshold signals' characteristics are analyzed to extract event features to form an event message.

An event is signified as a period of a continuous TRUE value for $BP_k$ or $BN_k$. The three event features generated for each event are: (1) arrival time: defined as the delay from the first threshold crossing on any observation signal; (2) duration: length of time that a binary signal is TRUE; (3) event polarity: a binary symbol indicating which of $BP_k$ or $BN_k$ is TRUE. Additionally, a flag is set at the end of each event to signal the higher-level stage to process the event message.

A critical challenge in online processing of multiple observation stages is to determine the amount of time that the high-power processor should remain awake to gather all events. This time determination is important since it is proportional to the energy consumed by the high-power processor. In the system 200, a counter (labeled "gesture-timeout") is preferably maintained that reflects this time. When gesturetimeout reaches 0, the event messages are propagated to an aggregation and filtering stage 290 called "Message Bundle Generation" in FIG. 4B.

FIG. 5 is an example of an algorithm for updating the value of gesturetimeout. The key step in the algorithm is to determine the duration of an event in an observation channel and increase gesturetimeout proportional to this duration. The duration of an event, described above, is indicative of two parameters: (1) the speed of performing the gesture; and (2) when another event might occur on a different observation channel.

The intuition behind the algorithm of FIG. 5, therefore, is that the event message generator must wait for events at least for that duration of time. Once the events are determined, they are propagated to the aggregation and filtering module that performs domain-specific filtering.

Instances have been found where spurious events are generated due to noise in the data caused by undesired user actions and sensor displacement. Area (iii) in FIG. 3B illustrates four such spurious events that are an outcome of improperly performing gestures and are filtered by the aggregation and filtering stage, using the per-channel rules, as follows: (1) an event with much larger duration than all previous durations in the same channel erases all previous event messages from the channel queue; (2) when two events with the same polarity exist in the same channel, only the longer event is kept in the channel queue; (3) in a channel, if two newer messages exist with significantly higher arrival time and longer duration than an earlier message, the earlier message is deleted; and (4) if two event messages exist in a channel queue with a significant ratio of their durations, the shorter message is deleted. The goal of these filtering rules is to ensure that the spurious events do not reach the machine learning-based gesture classifier. Some of these rules are illustrated in FIG. 4B.

Once the messages are aggregated across observation channels, the cross-channel rules are preferably applied to the aggregated events to filter noise and generate features for the machine learning algorithm, as follows: (1) if the total event duration of one channel, as defined by the sum of event durations in messages left in the queue at the time of gesture reporting, is much shorter than the average total duration of the others channels, then the messages in the former channel are deleted; (2) if the max total duration across all channels is small, the gesture is ignored and the messages are purged; and (3) events are labeled as P (positive) or N (negative) events depending on whether they are generated from a BP or BN signal respectively, otherwise they are labeled as NAE (not an event). If a channel has a complimentary pair of events positive-then-negative or negative-then-positive, they are combined to one message labeled PN or NP with a single duration calculated as the sum of the pair of durations. In case of NAE, the duration and arrival times are zero.

The resulting labeled events' features are passed to a gesture classifier 300. The features reported for each observation channel are: Event Label (P, N, PN, NP, NAE), duration, and arrival time with respect to the first event. The combination of event signatures on different observation channels is unique for a gesture. Hence, the event features are important to distinguish between gestures.

The duration, for instance, is representative of the speed of performing a gesture, which is user-specific, and can help the machine learning algorithm distinguish between gestures among users. The arrival time for an event on an observation channel encodes the velocity of the gesture (the speed and direction of motion). Together, these features help the machine learning algorithm, described below, infer the gestures accurately. The feature extraction and the machine learning classifying algorithm run in real-time on the microcontroller 220.

The final level in the hierarchy is a machine learning algorithm implemented by gesture classifier 300 that takes as an input a filtered message bundle and classifies the gestures. The machine learning algorithm is preferably trained using gestures performed by an individual subject. Several machine learning algorithms have been used, such as Nearest Neighbor Classifier, Decision Tree Classifier, and Naive Bayesian Classifier. A comparison of the accuracies, complexity and trade-offs is discussed below. Once the gesture classifier 300 determines a gesture, the Bluetooth low energy (BLE) module 230 is preferably woken up and the gesture is transmitted to a home automation hub 240, which controls a one or more appliances. The home automation hub can be suitably implemented with a computer or processor.

Implementation

A fully functional system 200 has been implemented as an end-to-end cyber-physical system for home automation. Gestures recognized by the system 200 are transmitted to a personal computer acting as a home automation hub 240 over BLE 120, and the hub 240 then controls appliances over a Zwave connection using a Micasaverde Vera gateway. The prototype consists of a custom-designed PCB board with the capacitance measurement circuit, observation calculation and thresholding circuit (built into the capacitance measurement IC), an MSP430 micro-controller 220, and a BLE wireless module 120. The capacitor plates 130 were sewn into denim fabric and attached to a data collection module using 4-ply conductive threads with a linear resistance of 50 Ω/meter.

In the implementation, two challenges were faced unique to designing textile-based wearable capacitor plates. First, the conductive threads are built by weaving silver-plated threads and non-conductive threads. Unfortunately, this leads to fraying on the ends of the thread and can cause microscopic shorts between adjacent threads which are difficult to diagnose, especially when vampire connectors are used to connect the thread to the data collection board. The second challenge was soldering onto the conductive threads, which was mitigated using vampire FCC connectors.

System Evaluation

One application of the present invention is providing accurate real-time gesture recognition for individuals with limited mobility using minimal energy consumption. To this end, the system was evaluated based on the following key questions: (1) how accurately does the system determine gestures across subjects?; (2) what is the energy consumption of the system of the present invention compared to a system that does not use hierarchical signal processing?; and (3) what are the trade-offs between accuracy of gesture recognition, training size and type of training data used? While answering these key questions, micro-benchmarks on the energy consumption of different subsystems were also determined, as well as the latency associated with different components of the system.

Experiments were performed on five adult subjects. While the subjects did not suffer from paralysis, they acted as a baseline for evaluating the accuracy of the gesture recognition system. In the experimental setup, the subject wore the CSA 110 on their thigh and performed swipe and hover gestures with their hand. Each subject performed an average of 180 gestures.

Figure 6:
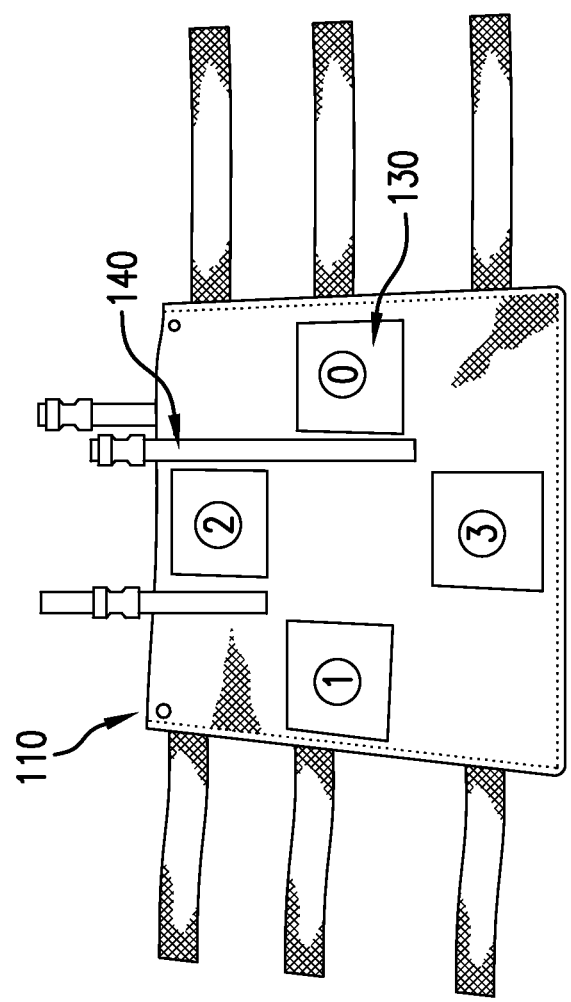
FIG. 6 is a perspective view a textile-based capacitive sensor array with four capacitor plates, in accordance with one preferred embodiment of the present invention.

A textile-based CSA with four capacitor plates 130, such as the one shown in FIG. 6, was used and the swipe gestures performed were the following: all combinations of i→j, where i/=j, and I and j are the plates 130 numbered from 0 through 3. Similarly, the gesture set included four hovers denoted by the plate numbers {0, 1, 2, 3}. Each subject was trained on how to perform the gestures before the experiments were performed. For all accuracy results, cross-validation was performed. Results on micro-benchmarks using the system, followed by results on accuracy, energy consumption, and system trade-offs are discussed below.

FIG. 7 shows two tables (Table I and Table II) that shows the power consumption and the latency of different subsystems. The power consumption table (Table I) illustrates the need for a hierarchical signal processing architecture. The Bluetooth module (BLE) 120 consumes an order of magnitude more power than the micro-controller 220 when active, which in turn consumes four times more power than the capacitance/observation calculation hardware. Hence, by keeping the micro-controller 220 and the Bluetooth module 120 off until the event generation module generates interesting events can save a substantial amount of energy. The hierarchical design, however, is useful only if the transition cost associated with wakeup times of different modules is low.

As illustrated in Table II, the wakeup latency associated with Bluetooth module 120 and micro-controller 220 wakeup is 450 μs and 36 μs respectively, demonstrating that the overhead of transition in the system is low. Additionally, it takes only 286 ms to execute the machine learning algorithm on the micro-controller 220, illustrating the efficiency of the system.

Figure 8A:
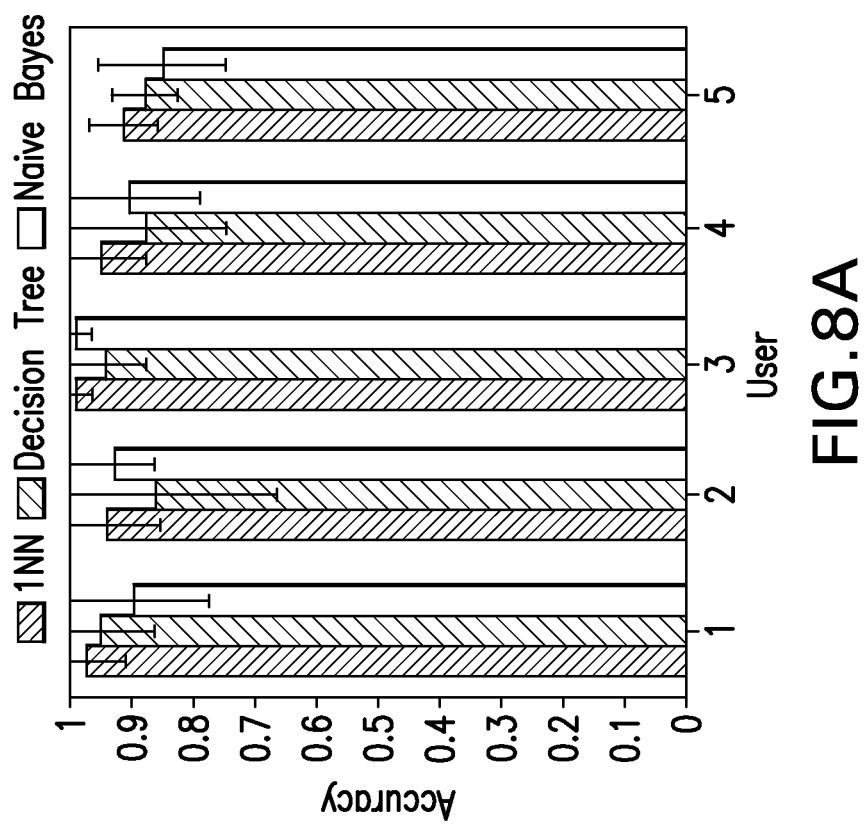
FIG. 8A are graphs showing the accuracy of gesture recognition for three machine learning algorithms across five subjects, in accordance with one preferred embodiment of the present invention.

One set of experiments focused on evaluating the accuracy of the system in recognizing gestures. FIG. 8A graphs the accuracy of recognizing the gestures for three machine learning algorithms (Nearest Neighbor classifier (1NN), Decision Tree classifier (Decision tree), and Naive Bayesian classifier (Naive Bayesian)) across five subjects. These three classifiers were chosen because they represent algorithms with a wide range of computational needs.

The Naive Bayesian classifier and the Decision Tree classifier require training that may not be feasible on a micro-controller 220. However, once these classifiers are trained, using them on a micro-controller 220 is computationally feasible. The Nearest Neighbor classifier can be completely implemented on a micro-controller 220. The results shows that the Nearest Neighbor classifier performs the best with an average accuracy of 93%. Hence, the Nearest Neighbor classifier was used in the system.

Figure 8B:
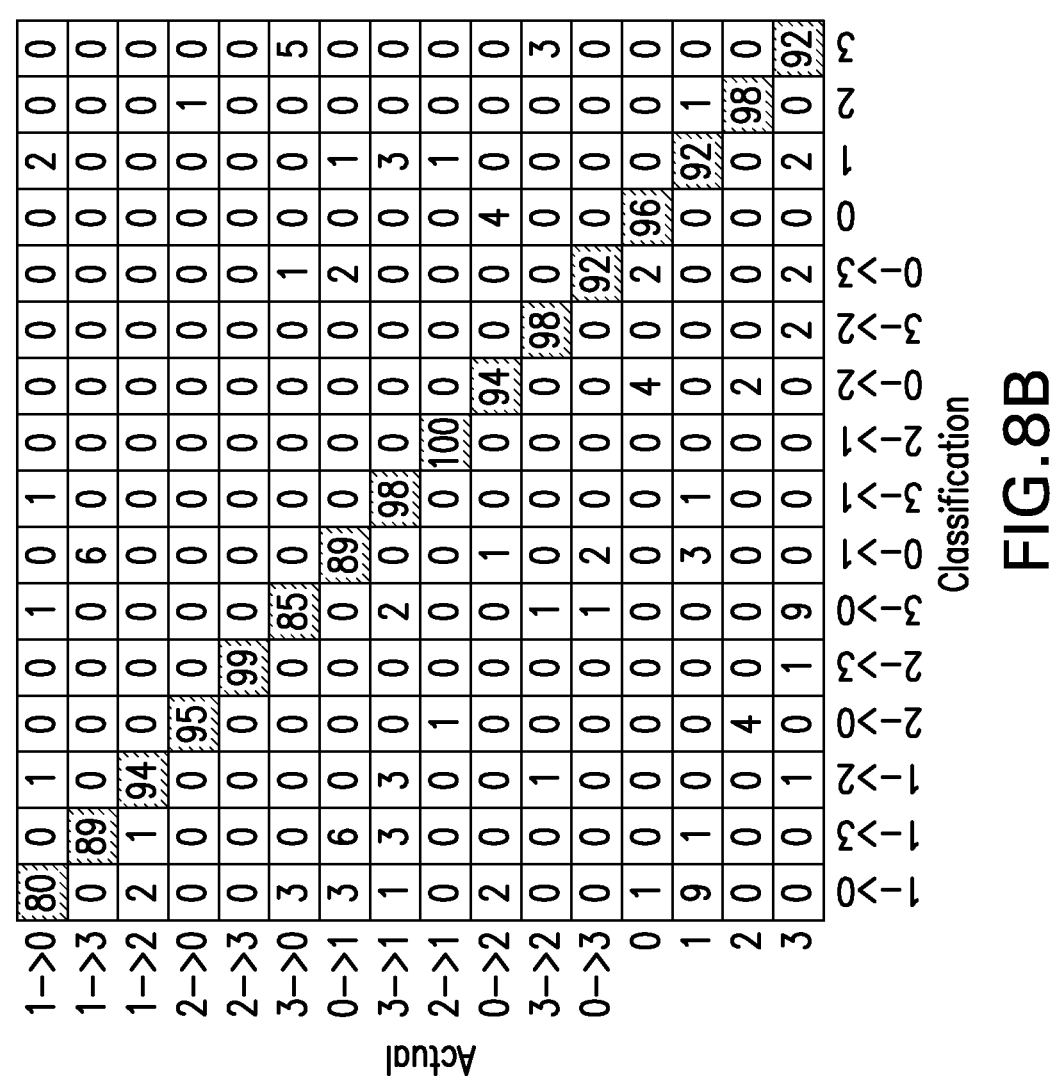

FIG. 8B is a confusion matrix that illustrates the percentage of gestures classified and misclassified for all sixteen gestures. The experiment presents data collected from all subjects. FIG. 8B shows that the lowest accuracies are for the swipe gestures performed when plate 1 was involved. Swipe gestures, 1→0, 1→3, and 1→2, have accuracies of 80%, 89%, and 94% respectively.

For testing, the CSA 110 was strapped onto the right leg and the subjects used their right hand to perform the gestures. Based on the orientation of the capacitor plates 130 illustrated in FIG. 6, swipes over plate 1 from any other plate will cause the subject to pass over other plates, causing the misclassifications. If the orientation is changed these missclassifications will occur on gestures performed on other plates. However, even with this interference with neighboring plates, the system is able to infer the gestures with an average accuracy of close to 93%.

Figure 9:
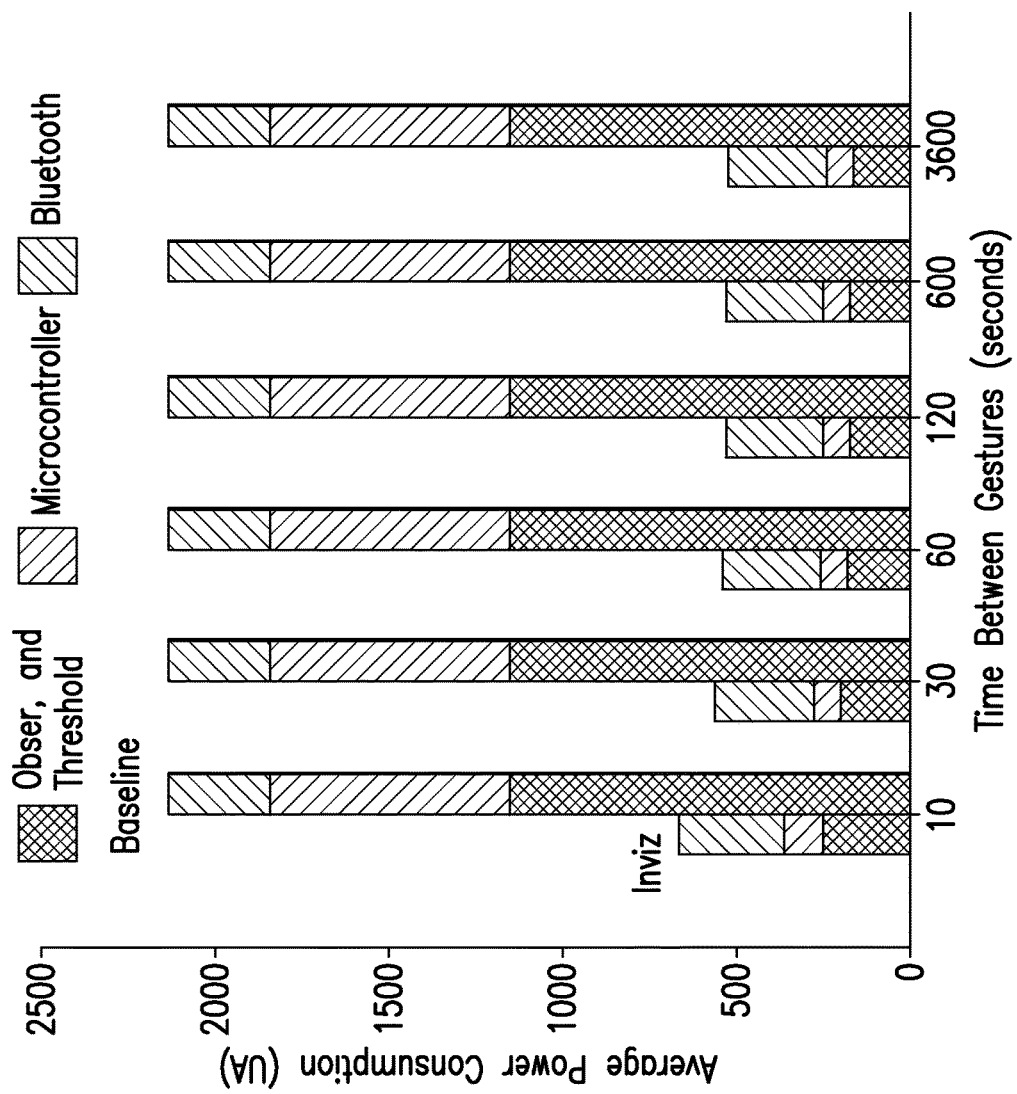
FIG. 9 is a graph that compares the energy consumption of a system with and without hierarchical signal processing, in accordance with one preferred embodiment of the present invention.

Another set of experiments explored the energy consumption of the system. FIG. 9 compares the energy consumption of a system with and without hierarchical signal processing. The system (termed Baseline) processes all the data on the micro-controller 220 and wakes up the Bluetooth module 120 only when a gesture is detected. FIG. 9 illustrates the average power consumption of the system when gestures are performed at the rate of once every 10 seconds, 30 seconds, 1 minute, 2 minutes, 10 minutes, and 60 minutes (the last two extrapolated from measurements). FIG. 9 also shows the breakdown of the power consumed by different components of the system, namely the observation and threshold calculation hardware, the micro-controller, and the Bluetooth module.

Three conclusions can be drawn from FIG. 9. First, the absolute power consumption of the system is low and is close to 525 μA (1.7 mW) when gestures are performed once every 2 minutes, which is a very high gesture performing frequency. On a 1000 mAh battery, the system would last for approximately 2000 hours (83 days) on a single charge.

Second, the system consumes four times lower power than a system that does not use a hierarchical architecture. Third, the two primary energy consumers in the system are the Bluetooth module 230 and the observation threshold calculation hardware. Thus, low power analog sub threshold circuits should preferably be used for implementing the observation and thresholding algorithms.

System Tradeoffs

Figure 10:
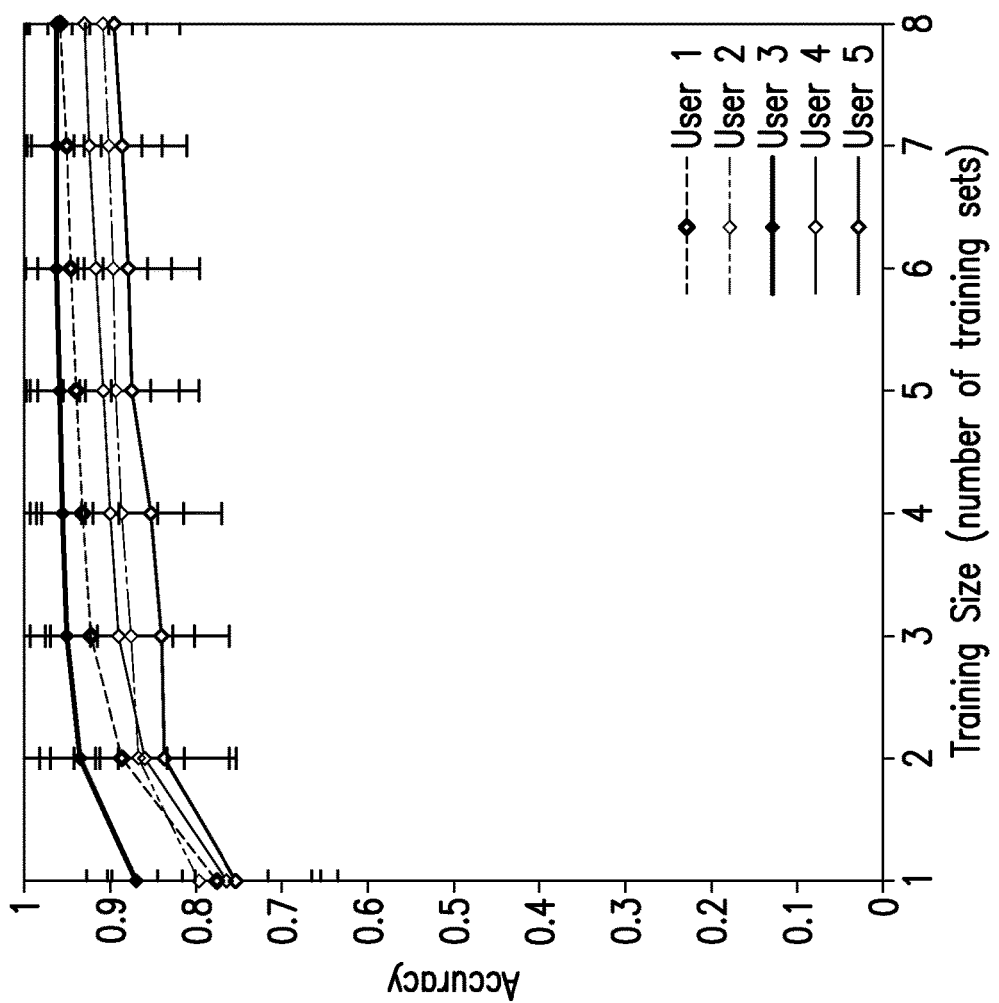
FIG. 10 is a graph showing the effect of training size on the accuracy of gesture recognition for Nearest Neighbor Classifier for five subjects, in accordance with one preferred embodiment of the present invention.

The tradeoffs associated with system were also evaluated. Specifically, the accuracy of recognizing gestures were evaluated as the training size is increased. FIG. 10 graphs the change in accuracy of the Nearest Neighbor classifier as the training set is increased for the five subjects. One training set comprised 16 gestures.

As shown in FIG. 10, as the number of training sets increase, the average accuracy improves. However, the accuracy saturates after five training sets. FIG. 10 demonstrates that the amount of training required for the system is low. This is a consequence of the intelligent event generation and filtering that is performed on the sensor data which reduces the complexity of the machine learning classifier.

Figure 11:
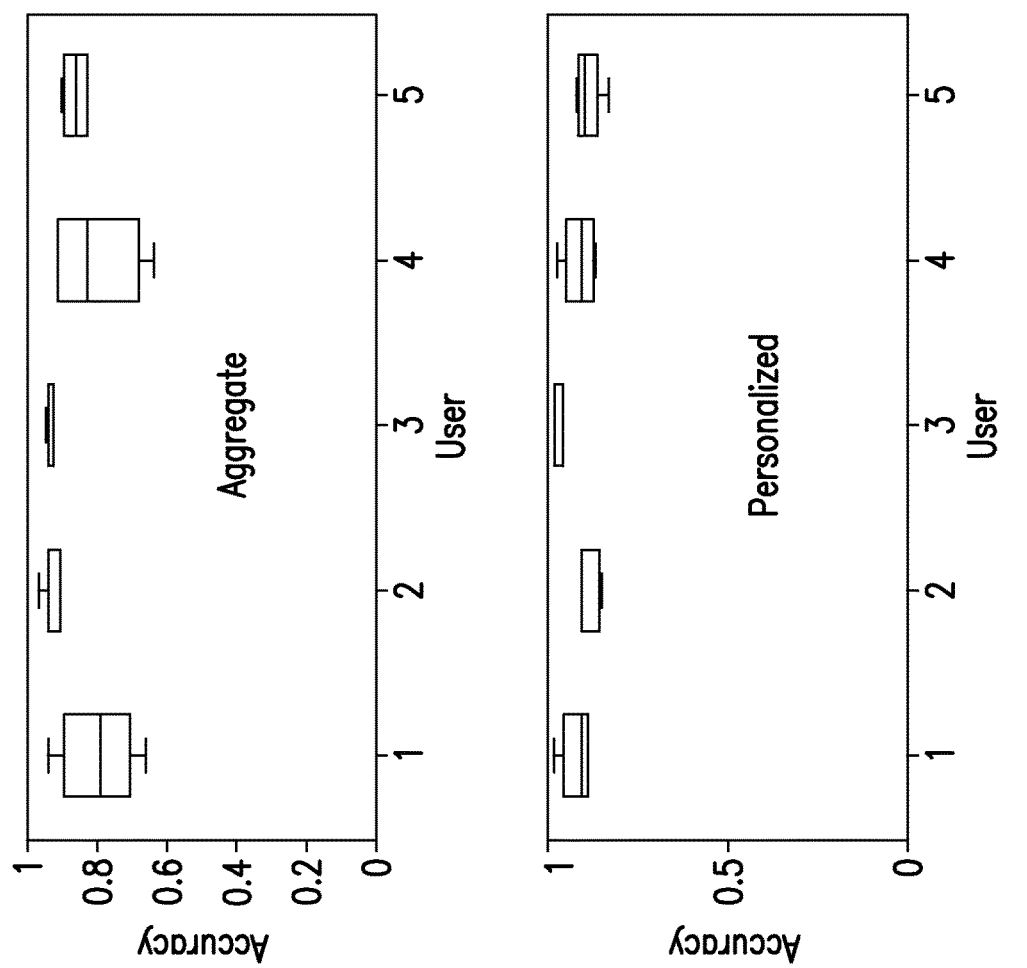
FIG. 11 is a graph that compares the accuracy of gesture recognition for the two training approaches, in accordance with one preferred embodiment of the present invention.

The next trade-off that was evaluated is the type of training used. Two cases were evaluated: (1) personalized training, where the classifier is trained per subject; and (2) aggregate training, where a single training set is used that is generated by randomly selecting five training sets across subjects. FIG. 11 compares the accuracy of gesture recognition for the two training approaches. FIG. 11 shows that there is high variance in the accuracy of user 1 and user 4 when aggregate training is used (top graph). However, the variance is low and the accuracy is higher when personalized training is used (bottom graph). In the user pool used for this experiment, users 1 and 4 have shorter forearms and legs compared to the other users. Hence, if the aggregate training set did not include data sets from these users, the classifier is unable to capture gesture attributes unique to these subjects. This problem is preferably addressed by using personalized per-user training.

Augmenting CSAs with Inertial Sensors

Textile-based CSAs have several advantages, including flexibility of placement, power consumption, and precision. The pliability of the textile-based CSAs that make them so useful, also present a challenge. The primary algorithmic challenge to determining motion using textile-based CSAs is improving accuracy. Capacitive sensors effectively measure changes in electric fields, which are computationally expensive to simulate and model completely in a changing environment. In a hospital environment in which a patient is in bed, any shifting of the patient or the sheets harboring the CSAs, or even the movement of nearby objects like bedding rails and other humans would invalidate the model and require recalibration to reestablish sufficient accuracy. Even the CSAs themselves are not fixed in form.

Figure 12:
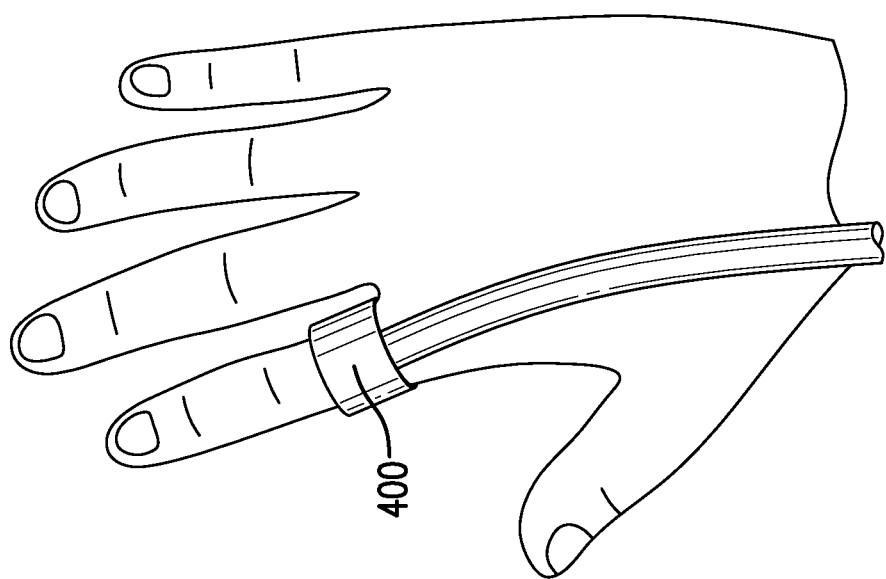
FIG. 12 shows an example of a wearable inertial sensor in the form of an accelerometer ring worn by a user, in accordance with one preferred embodiment of the present invention.

In contrast, inertial sensors, like accelerometers, would not have this disadvantage. The inertial sensors can be placed at strategic locations on the body, such as the ring on the finger, to capture localized movements, such as finger twitching. FIG. 12 shows an example of a wearable inertial sensor in the form of an accelerometer ring 400 worn by a user. The accelerometer ring 400 incorporates an accelerometer that is used as an inertial sensor.

Figure 13:
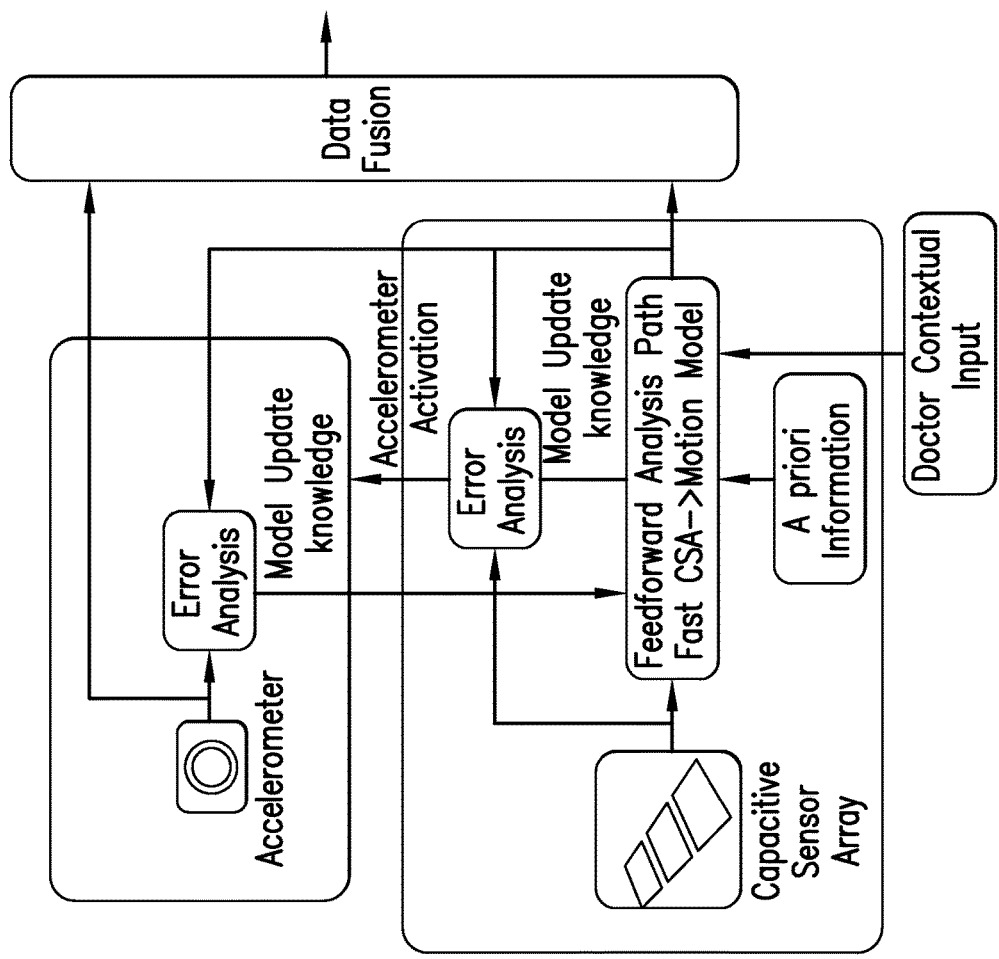
FIG. 13 is a schematic diagram illustrating a signal processing methodology when using capacitive sensor arrays and inertial sensors, in accordance with one preferred embodiment of the present invention.

To implement a flexible yet effective real-time movement model using inertial and capacitive sensors, a real-time feed forward model, which interprets motion from the CSA, is adapted with a priori knowledge combined with recent calibration data from the inertial sensor. The overall signal processing methodology is illustrated in the schematic diagram of FIG. 13. The first step is data preprocessing and filtering external interference in a particular environment. Computationally efficient Wiener filters [59] or Kalman filters [60] are preferably used for preprocessing that are designed for noise statistics stored in the appropriate environmental context.

The accelerometer and capacitor array readings relate to the hand positions and movements through the functions $a = F_{b \to a}(b)$ and $c = F_{b \to c}(b)$, where time-series a are accelerometer readings, b represents body part positions and movements, and c represents capacitor array readings. The ultimate goal is to produce the function $$F_{c \to b} \approx F_{b \to c}^{-1}$$

that allows on to sufficiently determine the body part(s) movements from CSA readings under short time constraints.

While the capacitive arrays can determine relative motion, they cannot determine whether the motion occurred due to movement of the arm, head, or legs without training. However, since the inertial sensor (e.g. accelerometer) is placed on the finger (for example), it can determine localized motion on the hand. Once the accelerometer data is collected, the function $F_{a \to b}$ can be built to estimate the motion of a certain body part.

For example, the x, y, z acceleration data can be used to estimate motion features such as the acceleration and speed of the hand as it is moved in an up-down motion. Therefore, $\{a, v\} = F_{a \to b}(a)$, would simply convert the acceleration vector to a relative velocity, (v), and acceleration, (a), compensating for gravitation (g) and calibration errors. The function $F_{c \to b}$ can now be learned using a regression model on the acceleration vector (a) or the velocity vector (v). As an illustrative example, in the scenario above, the regression model would be built as follows.

Assume that $c^1$ and $c^2$ correspond to the time series of capacitance values from the two capacitor plates, respectively. A first order difference in capacitance values for each series $$d_i = |c(t_i - t_{i-1})|$$

is proportional to changes in hand positions, and therefore, proportional to velocity of the hand.

Hence, $F_{c \to b}$ could simply correspond to the parameters of a simple linear regression $$\Sigma_{i=1}^{i=3} k_i \cdot d^i = a.$$

The parameters $k_1$, $k_2$ and $k_3$ can be stored as the model that maps a set of capacitance values to a hand gesture with the following motion features: average relative velocity=v and average acceleration=a. Any regression relies on selection of a cost function to be minimized. The cost function is preferably designed to account for the relative uncertainty of the data from a different source. For example, weights that are inversely proportional to variances are used under the assumption of Gaussian noise. Other alternative approaches to the linear regression described above for mapping of multidimensional capacitance data include multiple localized piece-wise regressions, Catmull-Rom Splines built from filtered data or Nearest neighbor interpolation.

The duality of using a simplistic model for the capacitance measurements is that it must be updated over time. However, a flexibility afforded by automatically retraining the feed-forward mechanism is the ability to adapt to unexpected scenarios. For example, consider a situation where the arm of a user moves from one position to another. Clearly the outdated function $F_{c \to b}$, would produce high errors since the position of the arm has changed. If the system determines that the sensor data deviates from the training space, it will preferably reactivate the accelerometer (e.g., the ring sensor 400) to rebuild the regression model parameters described above. Thus, the system can self-learn model parameters without external intervention.

The feed forward system described above uses the raw inertial and capacitance data to infer low level movement features, such as the speed and acceleration of body parts. However, mapping these low level movement features to gestures requires classifying the features. Segments of the data are preferably first quantized (i.e., map, classify) to some finite set of motions coarsely representing a combination of features like velocity and acceleration. A direct quantization of velocity and acceleration, for example, would generate motion types like slow motion, medium speed motion, and fast or jerky motion. The choice of quantization ranges for the classification would depend on the user conditions and context. Quantization is computationally efficient and can be implemented on processors located on the body.

The present system preferably detects gestures regardless of user conditions or environmental context. For example, if the user has had drug administration, the velocity of arm gestures are likely to be faster than normal. The present system preferably integrates this context to adapt the quantization ranges described above to determine the class of motion. In a hospital context, doctors maintain health records of times when a drug was administered to a patient, and when the patient takes his daily meals. These are factors that can affect the gestures. These contextual cues can be fed into the system using, for example, tablet computers that integrate with the controller 120, and it can consequently be integrated into the feedforward algorithm using a feedback system.

To illustrate how the system can incorporate patient conditions, an example is shown in FIG. 14, which is a table that shows the causal relationship between context, such as time, and patient conditions, such as drug administration and body movements. Such a table can be built, for example, using input from the caregiver or the patient's family.

Figure 15:
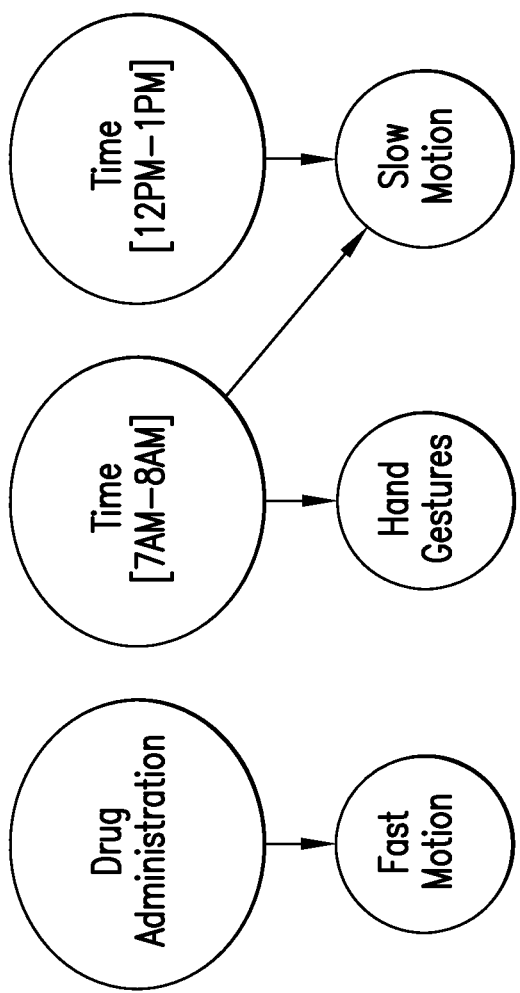
FIG. 15 is a dependency model graph derived from the table in FIG. 14, in accordance with one preferred embodiment of the present invention.

FIG. 15 is a dependency model graph derived from the table in FIG. 14. Any dependencies, such as Time=[7 AM-8 AM]→Patient Wakeup→Motion=slow, can be used to determine appropriate quantization thresholds that must be applied to classify the raw capacitance and acceleration data into "slow," "medium," and "fast" motion classes. The quantization ranges that must be applied for a given context can be learned by the system using a self-learning mechanism. This learning amounts to keeping track of movements of different body parts after a context or condition has occurred. For example, for a certain time of day (e.g., between 7 AM-8 AM), the system can monitor different hand gestures. Since it is known a priori from the table of FIG. 14 that hand gestures are slow after a patient wakes up, the quantization thresholds for "slow" arm motion for that time period can be calculated as the minimum and maximum velocity values inferred by the capacitive sensors using $F_{c \to b}$.

If the sensor values fall outside the ranges of the quantization ranges for all known context, then high level retraining must be performed to incorporate a new and perhaps unknown context. For instance, if the speed of hand movement falls outside the definition of "slow" or "fast" for all context available, the system may infer a new or altered context, and calculate quantization ranges for it.

User Feedback

The system can optionally provide the user with natural feedback signals. Such feedback can be important in the training phases, but is also useful for improving movement capabilities for patients in a caregiver facility and for patients undergoing physical therapy outside of a caregiver facility.

The feedback system preferably utilizes a visual display, and preferably provides natural feedback about the underlying perception of movements, and not just display final gesture determinations. This means displaying fluid deceptions or representations of users movements, suggestive of corrections. The visual display is preferably adapted to create emphasis by highlighting and using amplification or exaggeration of salient aspects of movements. Such perceptual amplification in the biofeedback can help the patient better understand where he needs to improve. This is especially important for severe paralysis patients where gestures are often quite slight and minimal, so much that the patients are uncertain themselves whether they are making the movements.

The magnification of the movement and the opportunity to give patients a functional end can help them improve. Aspects of those movements that deviate from expected movements are preferably emphasized. In the case of physical therapy, this can be used to improve the user's motions. Aspects of movements critical to classification of gestures are also preferably emphasized. For example, a key component in the determining the gesture of drawing an i or a j is at the end of the downward stroke. The horizontal movement towards the end of the gesture in a visual display can thus be highlighted and exaggerated to facilitate temporally critical feedback for motor learning. Amplification of the movement on the visual display is important because movement in paralysis patients can be subtle.

Providing the user context on why his movements differ from what is expected can help in learning. This amounts to inferring a context from the gestures, which is an inverse of the problem described above. Automatic context detection fits the problem statement of a Hidden Markov Model (HMM) where the hidden states are the contexts and the observables are the gestures.

FIG. 16 shows a mockup (generated using a 3D model) of a single frame of the visual display for providing feedback for a finger movement gesture. Two elements are illustrated in the hand mockup. First, the mockup compares the actual finger movement 500 with the expected finger motion 510. This feedback is preferably provided in real time using a 3D modeling tool, such as Unity or Blender. Second, the display magnifies and exaggerates the finger motion, hence, a paralysis patient with minimal movement capability can focus on the body movement that he is trying to improve. In addition, the system preferably displays the context (e.g., time of the day or drug administration) explaining why the patient's finger motion is not what is expected. A text-to-speech engine can be optionally used for personalized feedback.

The controller 120 can be implemented with any type of processing device, such as a special purpose computer, a distributed computing platform located in a "cloud", a server, a tablet computer, a smartphone, a programmed microprocessor or microcontroller and peripheral integrated circuit elements, ASICs or other integrated circuits, hard-wired electronic or logic circuits such as discrete element circuits, programmable logic devices such as FPGA, PLD, PLA or PAL or the like. In general, any device on which a finite state machine capable of running the programs and/or applications used to implement the systems and methods described herein can be used as the controller 120.

The foregoing embodiments and advantages are merely exemplary, and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. Various changes may be made without departing from the spirit and scope of the invention, as defined in the following claims (after the Appendix below).

APPENDIX

1. Young Sang Choi, Tiffany Chen, Advait Jain, Cressel Anderson, Jonathan D Glass, and Charles C Kemp. Hand it over or set it down: A user study of object delivery with an assistive mobile manipulator. In *Robot and Human Interactive Communication, 2009. RO-MAN 2009. The 18th IEEE International Symposium on*, pages 736-743. IEEE, 2009.
2. Febo Cincotti, Donatella Mattia, Fabio Aloise, Simona Bufalari, Gerwin Schalk, Giuseppe Oriolo, Andrea Cherubini, Maria Grazia Marciani, and Fabio Babiloni. Non-invasive braincomputer interface system: towards its application as assistive technology. *Brain research bulletin*, 75(6):796-803, 2008.
3. Holger Junker, Oliver Amft, Paul Lukowicz, and Gerhard Tröster. Gesture spotting with body-worn inertial sensors to detect user activities. *Pattern Recognition*, 41 (6):2010-2024, 2008.
4. An Y Benbasat and Joseph A Paradiso. An inertial measurement framework for gesture recognition and applications. In *Gesture and Sign Language in Human-Computer Interaction*, pages 9-20. Springer, 2002.
5. Sung-Jung Cho, Jong Koo Oh, Won-Chul Bang, Wook Chang, Eunseok Choi, Yang Jing, Joonkee Cho, and Dong Yoon Kim. Magic wand: a hand-drawn gesture input device in 3-d space with inertial sensors. In *IWFHR-9 2004*, pages 106-111. IEEE, 2004.
6. Ying Wu and Thomas S Huang. Vision-based gesture recognition: A re-view. In *Gesture-based communication in human-computer interaction*, pages 103-115. Springer, 1999.
7. Yi Xia, Zhi-Ming Yao, Xian-Jun Yang, Sheng-Qiang Xu, Xu Zhou, and Yi-Ning Sun. A footprint tracking method for footprint tracking method for gait analysis. *Biomedical Engineering: Applications, Basis and Communications*, 26(01), 2014.
8. Susan Koch Fager and Judith M Burnfield. Patients' experiences with technology during inpatient rehabilitation: opportunities to support in-dependence and therapeutic engagement. *Disability and Rehabilitation: Assistive Technology*, 9(2):121-127, 2013.
9. Gabe Cohn, Sidhant Gupta, Tien-Jui Lee, Dan Morris, Joshua R Smith, Matthew S Reynolds, Desney S Tan, and Shwetak N Patel. An ultra-low-power human body motion sensor using static electric field sensing. In *ACM Ubicomp*, pages 99-102. ACM, 2012.
10. Jingyuan Cheng, Oliver Amft, and Paul Lukowicz. Active capacitive sensing: Exploring a new wearable sensing modality for activity recognition. In *Pervasive Computing*, pages 319-336. Springer, 2010.
11. Hyun Kyu Ouh, Jungwoo Lee, Sangyun Han, Hyunjip Kim, Insik Yoon, and Soonwon Hong. A programmable mutual capacitance sensing circuit for a large-sized touch panel. In *ISCAS*, pages 1395-1398. IEEE, 2012.
12. Yang Piao, Xiaohui Xiao, Xiaozhao Wang, Quan Zhou, Kun Fan, and Pinkuan Liu. Conditioning circuit for capacitive position sensor with nano-scale precision based on ac excitation principle. In *IEEE EIT*, pages 1-6. IEEE, 2011.
13. Pavel Ripka and Alois Tipek. *Modern sensors handbook*. Wiley.com, 2013.
14. Lion Precision. Capacitive sensor operation and optimization. Technical report, Tech. rep. http://www.lionprecision.com/techlibrary/technotes/cap-0020-% sensortheory.html, 2006.
15. Peter Gründler. Conductivity sensors and capacitive sensors. *Chemical sensors: An introduction for scientists and engineers*, pages 123-132, 2007.
16. L Zhao and EM Yeatman. Micro capacitive tilt sensor for human body movement detection. In *BSN 2007*, pages 195-200. Springer, 2007.
17. Edin Terzic, Romesh Nagarajah, and Muhammad Alamgir. A neural network approach to fluid quantity measurement in dynamic environ-ments. *Mechatronics*, 21 (1): 145-155, 2011.
18. Jithendra N Palasagaram and Ramesh Ramadoss. Mems-capacitive pressure sensor fabricated using printed-circuit-processing techniques. *Sensors Journal*, IEEE, 6(6): 1374-1375, 2006.
19. Pei-Hsuan Lo, Chitsung Hong, Shih-Hsiung Tseng, Jen-Hao Yeh, and Weileun Fang. Implementation of vertical-integrated dual mode inductive-capacitive proximity sensor. In *MEMS 2012*, pages 640-643. IEEE, 2012.
20. Pei-Hsuan Lo, Chitsung Hong, Sung-Cheng Lo, and Weileun Fang. Implementation of inductive proximity sensor using nanoporous anodic aluminum oxide layer. In *Solid-State Sensors, Actuators and Microsystems Conference* (TRANSDUCERS), 2011 16th International, pages 1871-1874. IEEE, 2011.
21. Se Dong Min, Jin Kwon Kim, Hang Sik Shin, Yong Hyeon Yun, Chung Keun Lee, and Myoungho Lee. Non-contact respiration rate measurement system using an ultrasonic proximity sensor. *Sensors Journal*, IEEE,10 (11):1732-1739, 2010.
22. Rung-Huei Liang and Ming Ouhyoung. A real-time continuous gesture recognition system for sign language. In *Automatic Face and Gesture Recognition, 1998. Proceedings. Third IEEE International Conference on*, pages 558-567. IEEE, 1998.

What is claimed is:

1. A system for identifying gestures performed by an object, said object characterized by a conductivity and/or permittivity that will alter the capacitance of a capacitor when the object is in sufficiently close proximity to the capacitor, comprising:
   a capacitive sensor array comprising at least two flexible conductive plates and a ground layer spaced apart from the at least two flexible conductive plates; and
   a controller in communication with the at least two flexible conductive plates so as to receive signals from the at least two flexible conductive plates, wherein the controller utilizes a machine learning algorithm to identify gestures performed by the object based on the signals generated by the at least two flexible conductive plates;
   wherein each of the at least two flexible conductive plates are sized and shaped so as to generate sufficiently strong signals for the controller to identify gestures performed by the object when the object is within a predetermined distance range from each of the at least two flexible conductive plates and not in physical contact with any of the at least two flexible conductive plates.

2. The system of claim 1, wherein the object comprises a human appendage.

3. The system of claim 1, wherein the at least two flexible conductive plates are formed with conductive textile.

4. The system of claim 3, wherein the ground layer is formed with conductive textile.

5. The system of claim 4, wherein the capacitive sensor array is integrated into clothing.

6. The system of claim 1, wherein the gestures that the controller is adapted to identify comprise at least one of a hover gesture and a swipe gesture.

7. The system of claim 1, wherein the machine learning algorithm comprises at least one of: (1) Nearest Neighbor Classifier; (2) Decision Tree Classifier; and (3) Naive Bayesian Classifier.

8. The system of claim 1, wherein the controller is in communication with the at least two flexible conductive plates via a wireless connection.

9. The system of claim 1, wherein the controller is in communication with the at least two flexible conductive plates via a wired connection.

10. The system of claim 1, further comprising an inertial sensor attached to the object, wherein the controller is in communication with the inertial sensor so as to receive signals from the inertial sensor and determine localized movement of the object based on the inertial sensor signals.

11. The system of claim 10, wherein the inertial sensor comprises an accelerometer.

12. A method of identifying gestures performed by an object, said object characterized by a conductivity and/or permittivity that will alter the capacitance of a capacitor when the object is in sufficiently close proximity to the capacitor, comprising:

positioning a capacitive sensor array in proximity to the object, wherein the capacitive sensor array comprises at least two flexible conductive plates and a ground layer spaced apart from the at least two flexible conductive plates; and using a machine learning algorithm to identify a gesture performed by the object based on signals generated by each of the at least two conductive plates when the object is within a predetermined distance range from each of the at least two flexible conductive plates and not in physical contact with any of the at least two flexible conductive plates.

13. The method of claim 12, wherein the object comprises a human appendage.

14. The method of claim 12, wherein the at least two flexible conductive plates are formed with conductive textile.

15. The method of claim 14, wherein the ground layer is formed with conductive textile.

16. The method of claim 12, wherein gestures that can be identified comprise at least one of a hover gesture and a swipe gesture.

17. The method of claim 12, wherein the machine learning algorithm comprises at least one of: (1) Nearest Neighbor Classifier; (2) Decision Tree Classifier; and (3) Naive Bayesian Classifier.

18. The method of claim 12, further comprising determining localized movement of the object based on signals from an inertial sensor attached to the object.

* * * * *